(12) United States Patent
Shin

(10) Patent No.: US 10,032,879 B2
(45) Date of Patent: Jul. 24, 2018

(54) THIN FILM TRANSISTOR SUBSTRATE, DISPLAY APPARATUS INCLUDING THE SAME, METHOD OF MANUFACTURING THE SAME, AND METHOD OF MANUFACTURING DISPLAY APPARATUS INCLUDING THE SAME

(71) Applicant: SAMSUNG DISPLAY CO., LTD., Yongin, Gyeonggi-Do (KR)

(72) Inventor: Hyuneok Shin, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/796,060

(22) Filed: Jul. 10, 2015

(65) Prior Publication Data

US 2016/0181389 A1 Jun. 23, 2016

(30) Foreign Application Priority Data

Dec. 19, 2014 (KR) .................. 10-2014-0184955

(51) Int. Cl.
*H01L 29/423* (2006.01)
*H01L 29/66* (2006.01)
*H01L 29/786* (2006.01)

(52) U.S. Cl.
CPC .. *H01L 29/42384* (2013.01); *H01L 29/66757* (2013.01); *H01L 29/78636* (2013.01)

(58) Field of Classification Search
CPC ............ H01L 27/1248; H01L 29/4908; H01L 21/283; H01L 29/42384; H01L 29/786; H01L 29/66765
See application file for complete search history.

(56) References Cited

U.S. PATENT DOCUMENTS

| | | | | |
|---|---|---|---|---|
| 4,474,831 A | * | 10/1984 | Downey | H01L 21/3105 257/E21.241 |
| 4,986,878 A | * | 1/1991 | Malazgirt | H01L 21/31055 257/E21.245 |
| 5,051,380 A | * | 9/1991 | Maeda | C23C 16/402 148/DIG. 118 |
| 5,352,630 A | * | 10/1994 | Kim | H01L 21/02164 257/E21.243 |
| 2004/0041957 A1 | | 3/2004 | Yamaguchi et al. | |
| 2005/0285516 A1 | * | 12/2005 | Godo | H01L 51/5262 313/506 |
| 2006/0255719 A1 | * | 11/2006 | Oikawa | H01L 51/5206 313/503 |
| 2010/0006912 A1 | | 1/2010 | Larsen et al. | |
| 2016/0181389 A1 | * | 6/2016 | Shin | H01L 29/42384 257/72 |

FOREIGN PATENT DOCUMENTS

| | | |
|---|---|---|
| KR | 10-2004-0002601 A | 1/2004 |
| KR | 10-2005-0052730 A | 6/2005 |
| KR | 10-2005-0117847 A | 12/2005 |
| KR | 10-2009-0120697 A | 11/2009 |

* cited by examiner

*Primary Examiner* — Bilkis Jahan
*Assistant Examiner* — Victor Barzykin
(74) *Attorney, Agent, or Firm* — Lee & Morse P.C.

(57) ABSTRACT

A thin film transistor (TFT) substrate includes an insulating layer, an electrode on the insulating layer, and a main buffering layer connecting a side surface of the electrode to an upper surface of the insulating layer.

5 Claims, 6 Drawing Sheets

THIN FILM TRANSISTOR SUBSTRATE, DISPLAY APPARATUS INCLUDING THE SAME, METHOD OF MANUFACTURING THE SAME, AND METHOD OF MANUFACTURING DISPLAY APPARATUS INCLUDING THE SAME

CROSS-REFERENCE TO RELATED APPLICATION

Korean Patent Application No. 10-2014-0184955, filed on Dec. 19, 2014, in the Korean Intellectual Property Office, and entitled: "Thin Film Transistor Substrate, Display Apparatus Including The Same, Method Of Manufacturing The Same, and Method Of Manufacturing Display Apparatus Including The Same," is incorporated by reference herein in its entirety.

BACKGROUND

1. Field

One or more exemplary embodiments relate to a thin film transistor (TFT) substrate, a display apparatus including the TFT substrate, a method of manufacturing the TFT substrate, and a method of manufacturing the display apparatus. More particularly, one or more exemplary embodiments relate to a TFT substrate manufactured with no or reduced defects, a display apparatus including the TFT substrate, a method of manufacturing the TFT substrate, and a method of manufacturing the display apparatus.

2. Description of the Related Art

In general, a thin film transistor (TFT) substrate is a structure including a TFT formed on a substrate, the TFT including a semiconductor layer, a gate electrode, a source electrode, and a drain electrode. A display apparatus may be manufactured by using such a TFT substrate.

SUMMARY

One or more exemplary embodiments include a thin film transistor (TFT) substrate having no or reduced manufacturing defects, a display apparatus including the TFT substrate, a method of manufacturing the TFT substrate, and a method of manufacturing the display apparatus by using the above method.

According to one or more exemplary embodiments, a thin film transistor (TFT) substrate includes an insulating layer, an electrode on the insulating layer, and a main buffering layer connecting a side surface of the electrode to an upper surface of the insulating layer.

The main buffering layer may extend from an upper edge of the electrode to the upper surface of the insulating layer, an entire side surface of the electrode being covered by the main buffer layer, and the upper edge of the electrode being an intersection point of an upper surface and a side surface of the electrode.

The main buffering layer and the first auxiliary buffering layer may be formed integrally with each other.

The first auxiliary buffering layer may have a thickness of about 500 Å or less.

The TFT substrate may further include a second auxiliary buffering layer that is formed on the upper surface of the electrode, has a uniform thickness, and is connected to the main buffering layer. The main buffering layer and the second auxiliary buffering layer may be integrally formed with each other. The second auxiliary buffering layer may have a thickness of about 300 Å or less.

The uniform thickness of the second auxiliary buffering layer may be less than the uniform thickness of the first auxiliary buffering layer.

The main buffering layer has a concave surface.

The first auxiliary buffering layer may include a siloxane-based material. The first auxiliary buffering layer may include a siloxane-based material containing silicon and oxygen atoms by 15 weight % to 50 weight %.

The TFT electrode may be a gate electrode.

According to one or more exemplary embodiments, a display apparatus includes: the TFT substrate described above; and a display device disposed on the TFT substrate. The electrode may be a gate electrode.

According to one or more exemplary embodiments, a method of manufacturing a thin film transistor (TFT) substrate, the method includes: forming an insulating layer on a substrate; forming an electrode on the insulating layer; and forming a first auxiliary buffering layer on the insulating layer, a second auxiliary buffering layer on the electrode, and a main buffering layer that connects a side surface of the electrode and an upper surface of the insulating layer.

The first auxiliary buffering layer, the second auxiliary buffering layer, and the main buffering layer may include same material. The first auxiliary buffering layer, the second auxiliary buffering layer, and the main buffering layer may include a siloxane-based material. The siloxane-based material may contain silicon and oxygen atoms by 15 weight % to 50 weight %.

The forming of the first auxiliary buffering layer, the second auxiliary buffering layer, and the main buffering layer may be performed via a slit coating method or a spin coating method. The first auxiliary buffering layer may have a first thickness and the second auxiliary buffering layer may have a second thickness, wherein the first and second thicknesses may be uniform. The first thickness may be greater than the second thickness.

The main buffering layer may connect an edge where an upper surface and the side surface of the electrode meet each other to an upper surface of the insulating layer so that the side surface of the electrode is covered by the main buffering layer. The main buffering layer may have a concave surface.

The method may further include removing the second auxiliary buffering layer from the electrode. The removing of the second auxiliary buffering layer on the electrode may be performed via a dry etching method.

The method may further include removing the first auxiliary buffering layer from the insulating layer and the second auxiliary buffering layer from the electrode. The removing of the first auxiliary buffering layer from the insulating layer and the second auxiliary buffering layer from the electrode may be performed via a dry etching method.

The forming of the electrode may include forming a gate electrode on the insulating layer.

According to one or more exemplary embodiments, a method of manufacturing a display apparatus, the method includes: preparing a thin film transistor (TFT) substrate manufactured via the method described above; and forming a display device on the TFT substrate. The forming of the electrode may include forming a gate electrode on an insulating layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
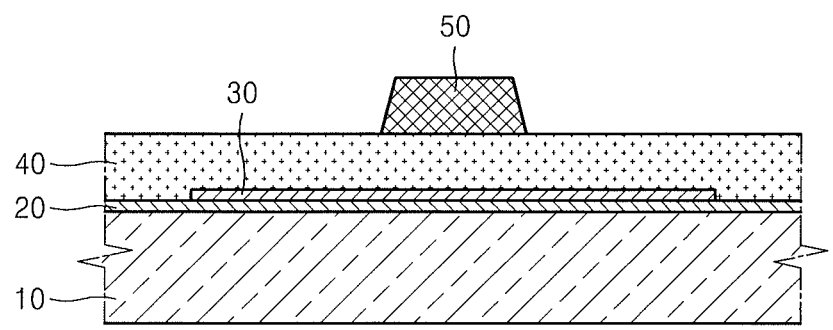
FIGS. 1-6 illustrate cross-sectional views of stages in a method of manufacturing a thin film transistor (TFT) substrate according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

FIGS. 1-6 illustrate schematic cross-sectional views of stages in a method of manufacturing a thin film transistor (TFT) substrate according to an exemplary embodiment.

First, as shown in FIG. 1, a semiconductor layer 30 is formed on a substrate 10. Here, the substrate 10 may include, e.g., glass, plastic, or metal. If necessary, a buffer layer 20, e.g., including silicon oxide or silicon nitride, may be formed on the substrate 10, and then, the semiconductor layer 30 may be formed on the buffer layer 20, as shown in FIG. 1. The semiconductor layer 30 may be an amorphous silicon layer or a polysilicon layer obtained by crystallizing amorphous silicon. In addition, the semiconductor layer 30 may be patterned as shown in FIG. 1, if necessary.

After that, a gate insulating layer 40 covering the semiconductor layer 30 is formed. The gate insulating layer 40 may be formed of any kind of material, provided that an electrode 50 to be formed later and the semiconductor layer 30 may be electrically insulated from each other via the gate insulating layer 40. For example, the gate insulating layer 40 may be formed of silicon oxide, silicon nitride, aluminum oxide, or silica gel.

After forming the gate insulating layer 40, the electrode 50 is formed on the gate insulating layer 40. The electrode 50 may be, e.g., a gate electrode. The gate electrode 50 may have a single-layered structure or a multi-layered structure. For example, the gate electrode 50 may include a first molybdenum layer contacting the gate insulating layer 40, an aluminum layer on the first molybdenum layer, and a second molybdenum layer on the aluminum layer. If the gate electrode 50 is formed of aluminum for obtaining high conductivity, hillock may occur on a surface of the aluminum layer during formation of the aluminum layer and patterning the aluminum layer by using a wet etching method. Thus, the first and second molybdenum layers may be disposed on upper and lower portions of the aluminum layer.

In addition, in order not to increase resistance even when widths of the gate electrode 50 and wires connected to the gate electrode 50 are reduced, the gate electrode 50 and the wires connected to the gate electrode 50 have to have sufficient heights, i.e., thicknesses. The gate electrode 50 may have a height of, e.g., about 1 μm. In particular, in order to form a display apparatus of a high resolution within a predetermined area by using the TFT substrate, widths of the electrodes and/or wires of the TFT substrate have to be reduced. Therefore, even in the above case, the gate electrode 50 is formed to have a sufficient height in order not to increase the resistances in the gate electrode 50 and/or the wires connected to the gate electrode 50.

Figure 2:
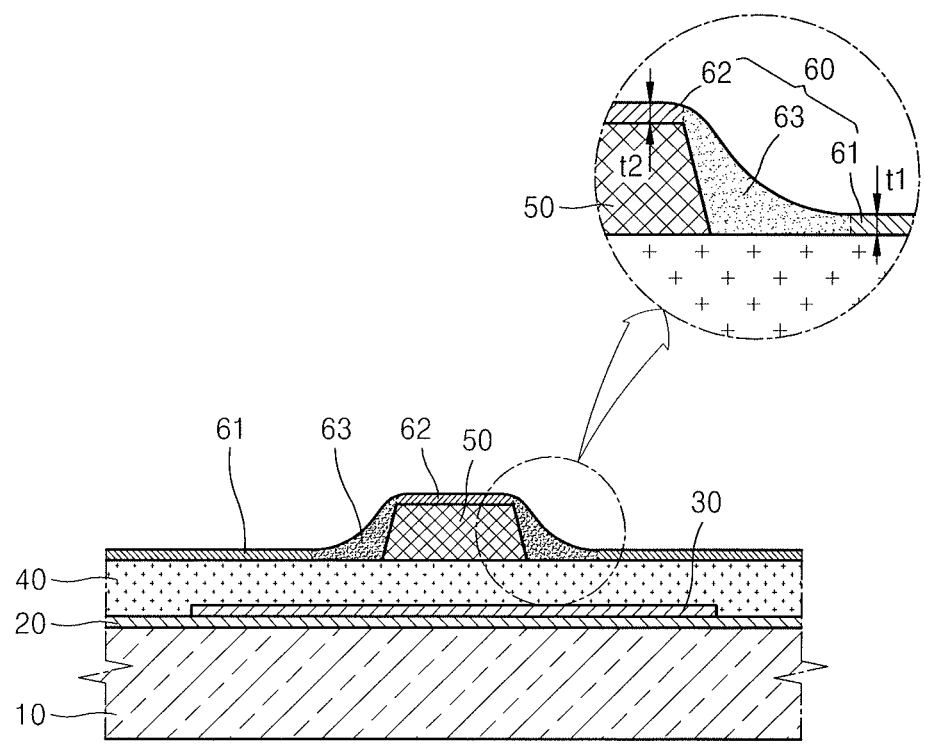

After that, as shown in FIG. 2, a step buffering layer 60 is formed to cover the gate electrode 50 and the gate insulating layer 40. The step buffering layer 60 includes a first auxiliary buffering layer 61, a second auxiliary buffering layer 62, and a main buffering layer 63. The first auxiliary buffering layer 61 is formed on the gate insulating layer 40, and the second auxiliary buffering layer 62 is formed on a top surface of the gate electrode 50. In addition, the main buffering layer 63 is formed to connect a side surface of the gate electrode 50 to an upper surface of the gate insulating layer 40.

The first auxiliary buffering layer 61, the second auxiliary buffering layer 62, and the main buffering layer 63 may be formed of the same material and at the same time. For example, a liquid phase material may be deposited, e.g., located, on the gate insulating layer 40, followed by spreading and baking the liquid phase material to cover the gate electrode 50 and the gate insulating layer 40 by using a spin coating method or a slit coating method to form the first auxiliary buffering layer 61, the second auxiliary buffering layer 62, and the main buffering layer 63. In particular, the first auxiliary buffering layer 61, the second auxiliary buffering layer 62, and the main buffering layer 63 may be formed of siloxane-based material. That is, a siloxane-based material is dissolved in a solvent, and then, the solvent is spin-coated and baked to form the step buffering layer 60. The siloxane-based material may be a high-molecular material or a low-molecular material.

The siloxane-based material included in the step buffering layer 60 formed as above may be polygomer or polymer including at least one of repeating units represented by formulas 1 to 3 below.

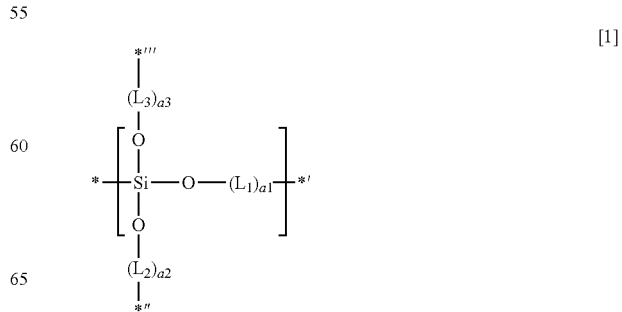

[1]

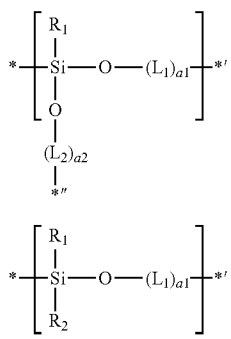

Formulas 1 to 3

In Formula 1 to 3, $L_1$ to $L_3$ may each independently be one of (i) —O—, $C_1$-$C_{20}$ alkylene group, $C_2$-$C_{20}$ alkenylene group, and $C_6$-$C_{14}$ arylene group, and (ii) $C_1$-$C_{20}$ alkylene group, $C_2$-$C_{20}$ alkenylene group, and $C_6$-$C_{14}$ arylene group each substituted with at least one of a deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, $C_1$-$C_{20}$ alkyl group, $C_1$-$C_{20}$ alkoxy group, a phenyl group, and a naphthyl group.

In Formulas 1 to 3, a1 to a3 may each independently be selected from integers of 0 to 10. In Formulas 1 to 3, $R_1$ and $R_2$ may each independently be selected from (i) a hydrogen, a deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, $C_1$-$C_{20}$ alkyl group, $C_1$-$C_{20}$ alkoxy group, $C_2$-$C_{20}$ alkenyl group and $C_6$-$C_{14}$ aryl group, and (ii) $C_1$-$C_{20}$ alkyl group, $C_1$-$C_{20}$ alkoxy group, $C_2$-$C_{20}$ alkenyl group and $C_6$-$C_{14}$ aryl group each substituted with at least one of a deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, $C_1$-$C_{20}$ alkyl group, $C_1$-$C_{20}$ alkoxy group, a phenyl group and a naphthyl group. In addition, *, *', *", and *''' are binding sites with neighboring repeating units.

For example, in the above Formulas 1 to 3, $L_1$ to $L_3$ are each independently selected from (i) —O— and $C_1$-$C_{10}$ alkylene group, and (ii) $C_1$-$C_{10}$ alkylene group substituted with at least one selected from —F, —Cl, —Br, —I, a hydroxyl group, a carboxylic acid or a salt thereof, $C_1$-$C_{20}$ alkyl group and $C_1$-$C_{20}$ alkoxy group. In addition, a1 to a3 may be each independently selected from integers of 0 to 5. In addition, $R_1$ and $R_2$ may be each independently selected from (i) a hydrogen, —F, —Cl, —Br, —I, a hydroxyl group, a carboxylic acid or a salt thereof, $C_1$-$C_{10}$ alkyl group and $C_1$-$C_{10}$ alkoxy group, and (ii) $C_1$-$C_{10}$ alkyl group and $C_1$-$C_{10}$ alkoxy group substituted with at least one selected from —F, —Cl, —Br, —I, a hydroxyl group, a carboxylic acid or a salt thereof, $C_1$-$C_{10}$ alkyl group and $C_1$-$C_{10}$ alkoxy group. In addition, *, *', *", and *''' are binding sites with neighboring repeating units.

According to an exemplary embodiment, in the above Formulas 1 to 3, a1 to a3 may be each independently 0, 1, or 2. For example, if a1 to a3 are respectively 0, -(L1)a1-, -(L2)a2-, and -(L3)a3- in Formula 1 are single bonds, respectively.

According to another exemplary embodiment, the siloxane-based material may be oligomer or polymer including all the repeating units expressed by the above Formula 1 to 3. According to another exemplary embodiment, the siloxane-based material may have hydrogen, —OH, or —$CH_3$ as a terminal group.

In addition, a molecular amount of the siloxane-based material has a weight average molecular weight (in terms of polystyrene) of 100 to 20,000 measured by gel permeation chromatography, but is not limited thereto.

When forming the above step buffering layer 60, a composition for forming a siloxane-based material including a Si-containing compound and a solvent is applied by a spin coating method or a slit coating method, and then, the Si-containing compounds in the composition for forming the siloxane-based material may be cross-linked. Here, the Si-containing compound may include at least one of silane-based compound and the siloxane-based compound.

For example, the Si-containing compound may be represented by Formula 4, but is not limited thereto.

In the above Formula 4, $R_{11}$ to $R_{14}$ may each independently be selected from (i) a hydrogen, a deuterium, —F, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, $C_1$-$C_{20}$ alkyl group, $C_1$-$C_{20}$ alkoxy group, $C_2$-$C_{20}$ alkenyl group and $C_6$-$C_{14}$ aryl group, (ii) $C_1$-$C_{20}$ alkyl group, $C_1$-$C_{20}$ alkoxy group, $C_2$-$C_{20}$ alkenyl group and $C_6$-$C_{14}$ aryl group each substituted with at least one selected from a deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, $C_1$-$C_{20}$ alkyl group, $C_1$-$C_{20}$ alkoxy group, a phenyl group and a naphthyl group, and at least one selected from $R_{11}$ to $R_{14}$ may be selected from a hydroxyl group and $C_1$-$C_{20}$ alkoxy group.

For example, in the above Formula 4, $R_{11}$ to $R_{14}$ may each independently be selected from (i) a hydrogen, —F, —Cl, —Br, —I, a hydroxyl group, a carboxylic acid or a salt thereof, $C_1$-$C_{10}$ alkyl group, $C_1$-$C_{10}$ alkoxy group and $C_2$-$C_{10}$ alkenyl group, and (ii) $C_1$-$C_{10}$ alkyl group, $C_1$-$C_{10}$ alkoxy group and $C_2$-$C_{10}$ alkenyl group substituted with at least one selected from —F, —Cl, —Br, —I, a hydroxyl group, a carboxylic acid or a salt thereof, $C_1$-$C_{10}$ alkyl group and $C_1$-$C_{10}$ alkoxy group, and at least one selected from $R_{11}$ to $R_{14}$ may be selected from a hydroxyl group and $C_1$-$C_{10}$ alkoxy group.

The solvent may be an organic solvent, for example, an aliphatic hydrocarbon-based solvent, e.g., n-pentane, iso-pentane, hexane, cyclohexane or chloroform; an aromatic hydrocarbon-based solvent, e.g., benzene, toluene or xylene; an alcohol-based solvent, e.g., methanol, ethanol, n-propanol, iso-propanol, n-butanol, iso-butanol, sec-butanol, or t-butanol; a ketone-based solvent, e.g., methyl ethyl ketone, methyl isobutyl ketone, cyclo hexanone, or acetyl acetone; an ether-based solvent, e.g., tetra hydro furan, 2-methyl tetrahydrofuran, ethyl ether, n-propyl ether, iso-propyl ether, iso-propyl ether, bis(2-methoxyethyl)ether, ethylene glycol methyl ether, or ethylene glycol ethyl ether; a ester-based solvent, e.g., methyl acetate, ethyl acetate, ethylene glycol methyl ether acetate, or propylene glycol methyl ether acetate; or a combination thereof.

In this case, the first auxiliary buffering layer 61 has a uniform thickness, i.e., a uniform first thickness t1, and the second auxiliary buffering layer 62 may have a uniform thickness, i.e., a uniform second thickness t2. Here, since a material of a liquid phase is positioned on the gate insulating layer 40 and then is spread to an upper surface of the gate electrode 50 by using the spin coating method or the slit coating method, the first thickness t1 is greater than the second thickness t2. For example, the first thickness t1 may be about 500 Å or less, and the second thickness t2 may be about 300 Å or less. In addition, the main buffering layer 63 connects a portion where an upper surface and a side surface of the gate electrode 50 contact each other and the upper surface of the gate insulating layer 40 to each other so as to cover the side surface of the gate electrode 50, and has a concave surface.

Figure 3:
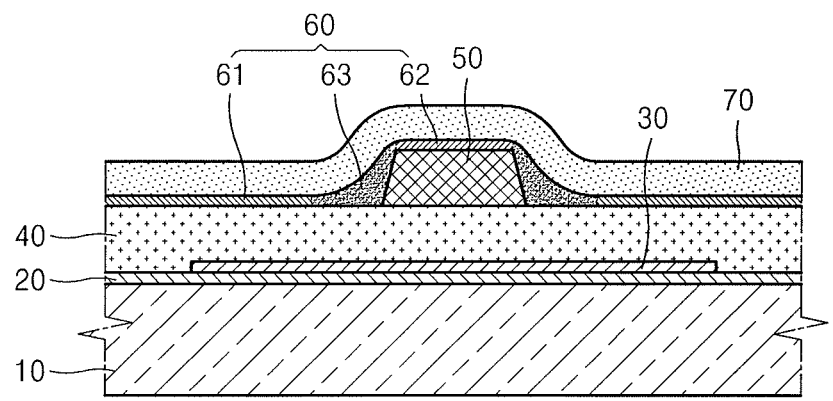
Figure 4:
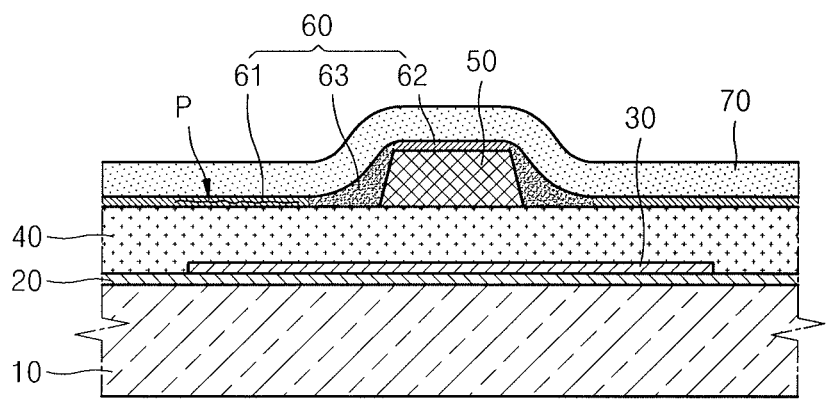

After forming the step buffering layer 60 as described above, an interlayer insulating layer 70 is formed, as shown in FIG. 3. The interlayer insulating layer 70 may be formed to have a single-layered structure or a multi-layered structure by using a chemical vapor deposition (CVD) method. For example, the interlayer insulating layer 70 may have a dual-layered structure including, e.g., a silicon oxide layer and a silicon nitride layer on the silicon oxide layer.

When the interlayer insulating layer 70 is formed as described above, the interlayer insulating layer 70 is formed along with a surface shape of a lower layer, on which the interlayer insulating layer 70 is to be formed. That is, the interlayer insulating layer 70 is formed conformally on the step buffering layer 60, such that the interlayer insulating layer 70 traces the shape of the upper surface of the step buffering layer 60. Here, since the step buffering layer 60 is formed on the gate electrode 50, i.e., the step buffering layer 60 separates the interlayer insulating layer 70 from the gate electrode 50, a height difference between portions of the interlayer insulating layer 70 on the gate electrode 50 and on the gate insulating layer 40 is minimized. As such, a crack may not be generated in the interlayer insulating layer 70 even when the gate electrode 50 is thick.

In contrast, if an interlayer insulating layer were to be formed by a CVD method conformally and directly on a thick gate electrode, i.e., without a step buffering layer, the interlayer insulating layer would trace the thick gate electrode and an underlying gate insulating layer. As such, the interlayer insulating layer would also trace the resultant steep angles between the thick gate electrode and the underlying gate insulating layer. Accordingly, the height difference and the steep angles due to the thick gate electrode would result in cracks in areas of the interlayer insulating layer corresponding to the steep angles between the thick gate electrode and the underlying gate insulating layer, i.e., where the interlayer insulating layer bends before extending upward to cover the gate electrode. In other words, since the gate electrode is thick, a step on a surface, on which the interlayer insulating layer is to be formed (an upper surface of the gate insulating layer and an upper surface of the gate electrode is rapidly changed, and accordingly, the crack may occur in the interlayer insulating layer around an edge of the gate electrode.

Further, even if attempts were made to form the thick gate electrode with a side surface having a slow inclination, such manufacturing practices would have been complicated. For example, if the gate electrode were to have a triple-layered structure, in which the first molybdenum layer is located under the aluminum layer and a second molybdenum layer is located on the aluminum layer, an etching rate of the second molybdenum layer that is the uppermost layer would be lower than that of the aluminum layer, and thus, it would have been complicated to etch the gate electrode to have a side surface with a slow inclination. That is, even if inclination of a partial side surface of the aluminum layer were to become slow, the second molybdenum layer on the aluminum layer would protrude to an outer portion of the aluminum layer. Accordingly, an inclination of a line connecting an edge of the second molybdenum layer, i.e., an edge of the upper surface of the gate electrode, and an edge of the first molybdenum layer, i.e., an edge of the lower surface of the gate electrode, with respect to the upper surface of the gate insulating layer may not be slow.

Therefore, according to the exemplary embodiment, the step buffering layer 60 is formed on the gate electrode 50. In particular, the main buffering layer 63 of the step buffering layer 60 covers the side surface of the gate electrode 50. Accordingly, even if the gate electrode 50 is thick and the inclination between the side surface of the gate electrode 50 and the gate insulating layer 40 is steep, the main buffering layer 63 may reduce the steep inclination. Thus, generation of cracks in the interlayer insulating layer 70 may be prevented, or even if the crack occurs, a size of the crack may be substantially reduced.

For example, the interlayer insulating layer 70 may be formed of an organic material so that the upper surface of the interlayer insulating layer 70 may be planarized even with the step of the gate electrode 50 and that the crack may not occur in the interlayer insulating layer 70. In another example, in order to prevent gas discharge from an organic material in the interlayer insulating layer 70 at high temperature processes, e.g., at a temperature of about 380° C. in subsequent processes, the interlayer insulating layer 70 may be formed of an inorganic material, e.g., silicon oxide and/or silicon nitride, on the step buffering layer 60. As such, gas generation during high temperature processes may be prevented.

In addition, after forming the interlayer insulating layer 70 on the step buffering layer 60, according to example embodiments, a peeling phenomenon in the step buffering layer 60 may be prevented. That is, peeling of a portion P inside, e.g., within, the first auxiliary buffering layer 61 (FIG. 4) may be prevented or substantially minimized by forming the step buffering layer 60 of a siloxane-based material. Further, since the adhesive force between the first auxiliary buffering layer 61 and the gate insulating layer 40 is excellent, peeling does not occur in an interface therebetween. Also, since the adhesive force between the first auxiliary buffering layer 61 and the interlayer insulating layer 70 is excellent, peeling does not occur in an interface therebetween.

In detail, the step buffering layer 60 according to example embodiments is formed of a siloxane-based material, i.e., a material containing silicon and oxygen atoms in an amount of about 15 weight % to about 50 weight % based on a total weight of the siloxane-based material. If the siloxane-based material contains silicon and oxygen atoms in an amount lower than 15 weight %, stressability of the layer formed of the siloxane-based material degrades, and peeling may occur in the first auxiliary buffering layer 61. If the siloxane-based material contains silicon and oxygen atoms in an amount higher than 50 weight %, a crack may occur in the step buffering layer 60 during or after formation of the step buffering layer 60.

Figure 5:
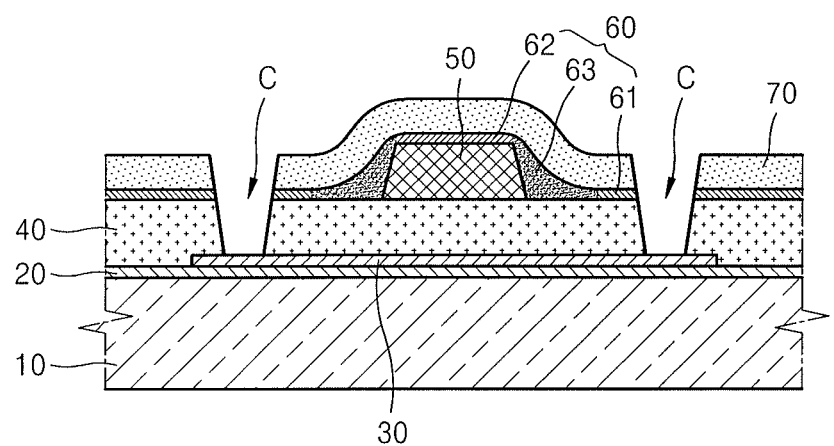

After that, as shown in FIG. 5, contact holes C are formed in the gate insulating layer 40, the step buffering layer 60, and the interlayer insulating layer 70 so as to expose a source region and a drain region of the semiconductor layer 30. Here, thickness of the step buffering layer 60 has to be adjusted so that the step buffering layer 60 may be completely removed when the contact holes C are formed. In contrast, if the step buffering layer 60 were to be formed too thick, the material for forming the step buffering layer 60 would not be completely removed from the semiconductor layer 30 during formation of the contact holes C, thereby hindering proper contact between the semiconductor layer 30 and subsequently formed drain and source electrode.

Figure 6:
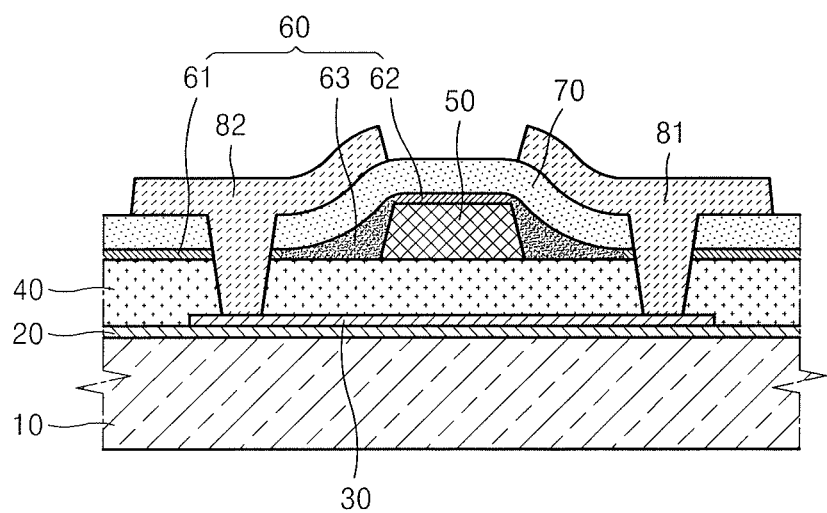

In detail, the first thickness t1, i.e., the thickness of the first auxiliary buffering layer 61, may be equal to or less than about 500 Å. If the first thickness t1, i.e., the thickness of the first auxiliary buffering layer 61, is greater than 500 Å, the material for forming the first auxiliary buffering layer 61 may not be completely removed from the semiconductor layer 30 during formation of the contact holes C. After forming the contact holes C as described above, a drain electrode 81 and a source electrode 82 are formed as shown in FIG. 6, and then, a TFT is formed on the substrate 10.

According to the method of manufacturing the TFT substrate of the present exemplary embodiment, the TFT substrate is manufactured by using the step buffering layer 60. Thus, occurrence of cracks in the interlayer insulating layer 70 may be prevented or substantially, e.g., sizes thereof, reduced. Therefore, defective rate during the manufacturing processes of the TFT substrate may be greatly reduced.

Figure 7:
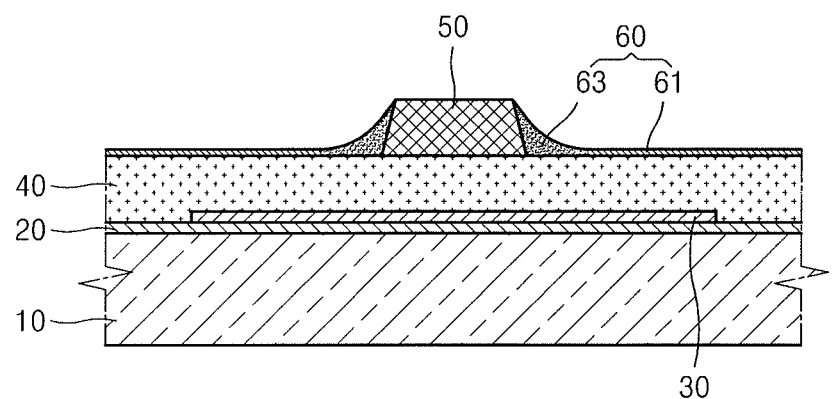
FIGS. 7 and 8 illustrate schematic cross-sectional views of stages in a method of manufacturing a TFT substrate according to another exemplary embodiment.
Figure 8:
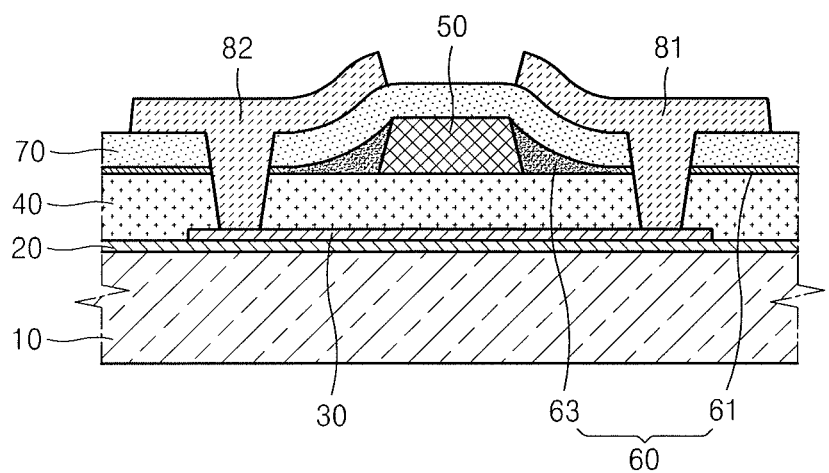

FIGS. 7 and 8 illustrate schematic cross-sectional views of a method of manufacturing a TFT substrate according to another exemplary embodiment. According to the method of manufacturing the TFT substrate of the present exemplary embodiment, the step buffering layer 60 is formed as shown in FIG. 2, and a process of removing the second auxiliary buffering layer 62 on the gate electrode 50 may be performed as shown in FIG. 7.

In detail, referring to FIG. 7, the second auxiliary buffering layer 62 may be removed from the gate electrode 50 by using a dry etching method. In this case, the dry etching may be performed with respect to an entire surface of the substrate 10 without using a mask for removing only the second auxiliary buffering layer 62 on the gate electrode 50. Therefore, the manufacturing processes may not be complicated when removing the second auxiliary buffering layer 62 from the gate electrode 50. During the above processes, the second auxiliary buffering layer 62 that is thin is removed, and the first auxiliary buffering layer 61 and the main buffering layer 63, which are thicker than the second auxiliary buffering layer 62, remain on the gate insulating layer 40. After performing the dry etching process, the thickness of the first auxiliary buffering layer 61 is reduced relatively to the thickness thereof in FIG. 2.

After that, referring to FIG. 8, the contact holes are formed. Then, the drain electrode 81 and the source electrode 82 are formed to form the TFT substrate.

According to the method of manufacturing the TFT substrate of the present exemplary embodiment, the thickness of the first auxiliary buffering layer 61 is reduced. Accordingly, peeling may be prevented from being generated in the first auxiliary buffering layer 61, even if the step buffering layer 60 is formed of a siloxane-based material containing silicon and oxygen atoms in an amount lower than 15 weight % or higher than 50 weight %. Also, since the thickness of the first auxiliary buffering layer 61 is reduced, complete removal of the first auxiliary buffering layer 61 from the semiconductor layer 30 within the contact holes during formation of the contact holes is improved.

Figure 9:
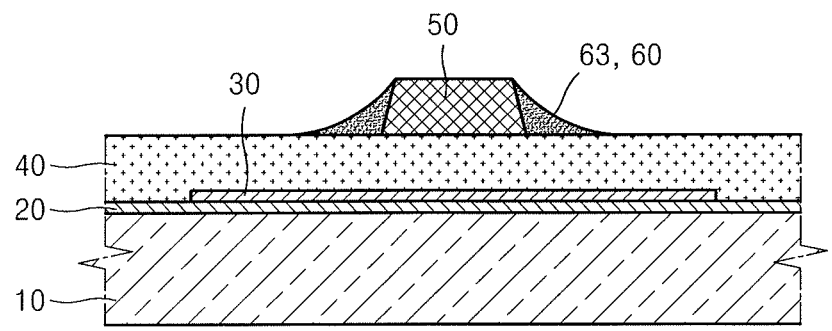
FIGS. 9 and 10 illustrate schematic cross-sectional views of stages in a method of manufacturing a TFT substrate according to yet another exemplary embodiment.
Figure 10:
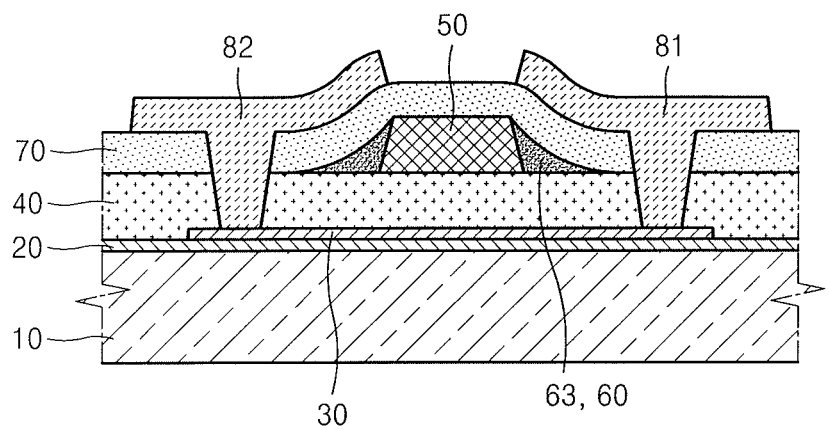

FIGS. 9 and 10 illustrate schematic cross-sectional views of processes of manufacturing a TFT substrate according to yet another exemplary embodiment. According to the present exemplary embodiment, the step buffering layer 60 is formed as shown in FIG. 2, and after that, the first auxiliary buffering layer 61 on the gate insulating layer 40 and the second auxiliary buffering layer 62 on the gate electrode 50 may be removed. That is, only the main buffering layer 63 covering the side surfaces of the gate electrode 50 on the gate insulating layer 40 remains.

Referring to FIG. 9, the first auxiliary buffering layer 61 on the gate insulating layer 40 and the second auxiliary buffering layer 62 on the gate electrode 50 may be removed by using a dry etching method. In this case, the dry etching may be performed with respect to the entire surface of the substrate 10 without using a mask in order to remove the first auxiliary buffering layer 61 from the gate insulating layer 40 and the second auxiliary buffering layer 62 from the gate electrode 50. Therefore, the manufacturing processes may be simplified when removing the first auxiliary buffering layer 61 from the gate insulating layer 40 and the second auxiliary buffering layer 62 from the gate electrode 50. Here, since the second auxiliary buffering layer 62 on the gate electrode 50 is thinner than the first auxiliary buffering layer 61 on the gate insulating layer 40, the second auxiliary buffering layer 62 is removed together with the first auxiliary buffering layer 61.

After that, referring to FIG. 10, the contact holes are formed. Next, the drain electrode 81 and the source electrode 82 are formed to form the TFT substrate.

According to the method of manufacturing the TFT substrate of the present exemplary embodiment, the first auxiliary buffering layer 61 is removed, and thus, peeling may be prevented from being generated in the first auxiliary buffering layer 61, even if the step buffering layer 60 is formed of a general siloxane-based material containing silicon and oxygen atoms in an amount lower than 15 weight % or higher than 50 weight %. Also, since the first auxiliary buffering layer 61 is, e.g., completely, removed, removal of material from the semiconductor layer 30 within the contact holes during formation of the contact holes is substantially improved.

One or more exemplary embodiments are not limited to the above-described method of manufacturing the TFT substrate. For example, a method of manufacturing a display apparatus by forming a display device on the TFT substrate, after preparing the TFT substrate by using the above-described method of manufacturing the TFT substrate, may be also applied to the one or more embodiments.

Figure 11:
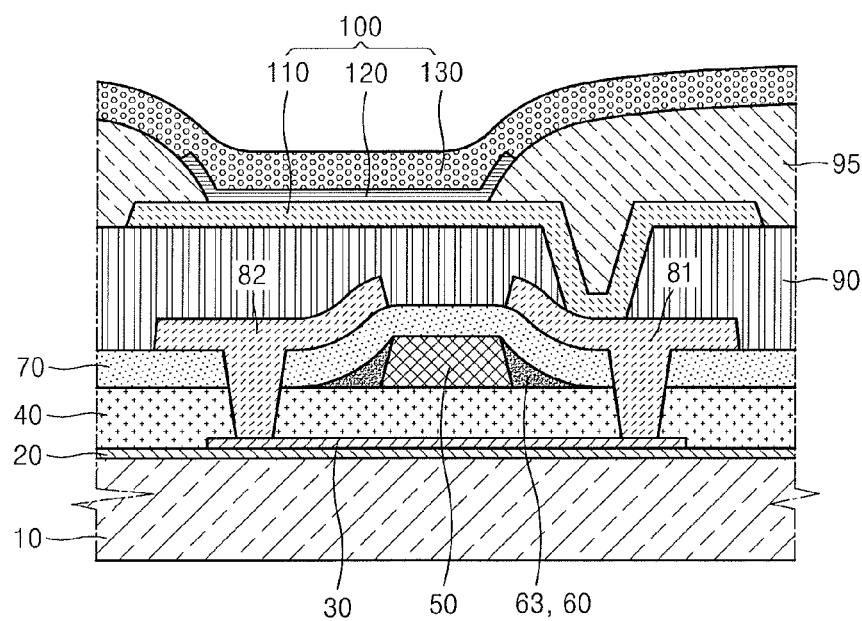
FIG. 11 illustrates a cross-sectional view of a part of a display apparatus manufactured according to a method of manufacturing a display apparatus according to an exemplary embodiment.

For example, after forming the TFT substrate by using the method of manufacturing the TFT substrate with reference to FIGS. 9-10, a pixel electrode 110 may be formed on a protective layer or a planarization layer 90 covering the TFT to be connected to the drain electrode 81, as illustrated in FIG. 11. In addition, a pixel defining layer 95 covering edges of the pixel electrode 110 is formed, and an intermediate layer 120 including at least an emission layer is formed on the pixel electrode 110. Then, an opposite electrode 130 is formed to manufacture the display apparatus including an organic light-emitting display device 100.

In addition to the method of manufacturing the TFT substrate or the method of manufacturing the display apparatus, the one or more exemplary embodiments of the inventive concept may be applied to the TFT substrate itself.

The TFT substrate according to an exemplary embodiment may have a structure as shown in FIG. 10, for example. In particular, the TFT substrate may include the gate insulating layer 40, the gate electrode 50 disposed on the gate insulating layer 40, and the main buffering layer 63 connecting the side surface of the gate electrode 50 to the upper surface of the gate insulating layer 40. The main buffering layer 63 may connect a corner where the upper surface and the side surface of the gate electrode 50 meet each other to the upper surface of the gate insulating layer 40 to cover the side surfaces of the gate electrode 50. As such, even if the gate electrode 50 is formed to be thick in order to reduce the resistance of the gate electrode 50 or wires connected to the gate electrode 50, the step generated due to the gate electrode 50 may be smoothed by the main buffering layer 63, and thus, the cracks may be effectively prevented from being generated in the interlayer insulating layer 70 covering the gate electrode 50. The main buffering layer 63 may include, e.g., a siloxane-based material.

The TFT substrate according to another exemplary embodiment may have the structure shown in FIG. 8. In more detail, the TFT substrate may further include the first auxiliary buffering layer 61. The first auxiliary buffering layer 61 is located on the gate insulating layer 40 to a uniform thickness, and may be connected to the main buffering layer 63. The smoothing effect of the step generated by the gate electrode 50 may be further improved by the first auxiliary buffering layer 61. The first auxiliary buffering layer 61 may be formed integrally with the main buffering layer 63, and may have a thickness of about 500 Å or less.

The TFT substrate according to another exemplary embodiment may have the structure as shown in FIG. 6. In more detail, the TFT substrate may further include the second auxiliary buffering layer 62. The second auxiliary buffering layer 62 is disposed on the upper surface of the gate electrode 50 to a uniform thickness, and may be connected to the main buffering layer 63. The second auxiliary buffering layer 62 may be formed integrally with the first auxiliary buffering layer 61 and the main buffering layer 63. As such, when the second auxiliary buffering layer 62 is located on the gate electrode 50, the processes of forming the step buffering layer 60 may be simplified, and accordingly, a manufacturing yield and time may be improved.

The second thickness t2, i.e., the thickness of the second auxiliary buffering layer 62, may be less than the first thickness t1, i.e., the first auxiliary buffering layer 61. When the first auxiliary buffering layer 61, the second auxiliary buffering layer 62, and the main buffering layer 63 are formed by locating, e.g., depositing, a material in liquid phase on the gate insulating layer 40, and spreading the material to the upper surface of the gate electrode 50 by spin coating or slit coating processes, the first thickness t1 may be greater than the second thickness t2. For example, the first thickness t1 may be about 500 Å or less, and the second thickness t2 may be about 300 Å or less. In addition, the main buffering layer 63 connects the corner where the upper and side surfaces of the gate electrode 50 meet each other to the upper surface of the gate insulating layer 40 to cover the side surfaces of the gate electrode 50, and may have a concave surface.

In addition, the first auxiliary buffering layer 61, the second auxiliary buffering layer 62, and the main buffering layer 63 may include a siloxane-based material that contains silicon and oxygen atoms in an amount of about 15 weight % to about 50 weight %, based on a total weight of the siloxane-based material. If the siloxane-based material contains silicon and oxygen atoms in an amount lower than 15 weight %, stressability of the layer formed of the siloxane-based material degrades, and peeling may occur in the first auxiliary buffering layer 61. If the siloxane-based material contains silicon and oxygen atoms in an amount higher than 50 weight %, cracks may occur in the step buffering layer 60 during or after formation of the step buffering layer 60.

The TFT substrate according to example embodiments is described above. However, the one or more exemplary embodiments are not limited thereto, and may be applied to a display apparatus including the TFT substrate. For example, the display apparatus according to the exemplary embodiment may include the TFT substrate of FIG. 10 and the organic light-emitting display device (OLED) 100 (see FIG. 11) disposed on the TFT substrate. That is, as shown in FIG. 11, an organic light emitting display apparatus including the OLED 100 includes the pixel electrode 110 disposed on the protective layer or the planarization layer 90 covering the TFT and connected to the drain electrode 81, the intermediate layer 120 including at least one emission layer and disposed on the pixel electrode 110, and the opposite electrode 130 located on the intermediate layer 120. Also, the organic light emitting display apparatus may further include other elements, e.g., the pixel defining layer 95 covering edges of the pixel electrode 110.

The display apparatus according to the present exemplary embodiment may prevent cracks from generating in the interlayer insulating layer 70 or may reduce the size of the cracks by using the step buffering layer 60, and thereby imparting to the display apparatus excellent quality. The step buffering layer 60 for smoothing the step of the gate electrode 50 is described above, but one or more exemplary embodiments are not limited thereto. For example, the step buffering layer 60 may be used for smoothing the step caused by the drain electrode 81, the source electrode 82, or other wires, than the gate electrode 50.

By way of summation and review, in order to form a display apparatus having high resolution within a predetermined area by using a TFT substrate, widths of electrodes and/or wires in the TFT substrate have to be reduced, and accordingly, the thickness of the electrodes and/or wires have to increase in order not to increase the resistances of the electrodes and/or wires. However, defects may occur during the manufacturing of a display apparatus when the thicknesses of the electrodes and/or wires increase in the TFT substrate.

In contrast, according to the one or more of the above exemplary embodiments, the TFT substrate may include a step buffering layer between a gate electrode and an interlayer insulating layer. As such, manufacturing defects may be prevented or substantially reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin film transistor (TFT) substrate, comprising:
an insulating layer;
an electrode on the insulating layer;
a main buffering layer connecting a side surface of the electrode to an upper surface of the insulating layer, the main buffering layer having a curved surface that curves continuously along an entirety of the side surface of the electrode from a top of the electrode to the insulating layer; and
an interlayer insulating layer covering the electrode and the main buffering layer,
wherein the main buffering layer is not covering an upper surface of the electrode, and the interlayer insulating layer is in direct contact with the upper surface of the electrode.

2. The TFT substrate as claimed in claim 1, further comprising a first auxiliary buffering layer on the upper surface of the insulating layer, the first auxiliary buffering layer having a uniform thickness, the first auxiliary buffering layer being connected to the main buffering layer.

3. The TFT substrate as claimed in claim 2, wherein the main buffering layer and the first auxiliary buffering layer are integral with each other.

4. The TFT substrate as claimed in claim 2, wherein the first auxiliary buffering layer has a thickness of about 500 Å or less.

5. The TFT substrate as claimed in claim 1, wherein the main buffering layer includes a siloxane-based material containing silicon and oxygen atoms in an amount of about 15 weight % to about 50 weight % based on a total weight of the siloxane-based material.

* * * * *